US006583058B1

United States Patent
Rajendran et al.

(10) Patent No.: US 6,583,058 B1
(45) Date of Patent: Jun. 24, 2003

(54) SOLID HERMETIC VIA AND BUMP FABRICATION

(75) Inventors: Sankerlingam Rajendran, Plano, TX (US); Rajiv S. Shah, Boynton Beach, FL (US); Van T. Vo, Irving, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/326,215

(22) Filed: Jun. 4, 1999

Related U.S. Application Data

(60) Provisional application No. 60/088,298, filed on Jun. 5, 1998.

(51) Int. Cl.[7] .............................................. H01L 21/44
(52) U.S. Cl. ....................... 438/675; 438/107; 438/108; 438/121; 438/125
(58) Field of Search ................................ 438/675, 108, 438/107, 121, 125

(56) References Cited

U.S. PATENT DOCUMENTS 5,970,608 A  * 10/1998  Tighe et al. ................... 29/843
5,904,499 A  *  5/1999  Pace ........................... 438/108
6,071,597 A  *  6/2000  Yang et al. ................... 428/209

* cited by examiner

*Primary Examiner*—David Nelms
*Assistant Examiner*—Reneé R. Berry
(74) *Attorney, Agent, or Firm*—Frederick J. Telecky, Jr.; W. James Brady, III

(57) ABSTRACT

A method of forming an electrically conductive via with bumps on both sides of a substrate wherein there is provided a substrate having a pair of opposing surfaces and a via extending between the opposing surfaces. A layer of a material capable of forming a seed for receiving thereon a plating material is provided on one of the surfaces extending to the via. The structure is then placed into an electroplating bath, preferably gold-containing, to electroplate the walls of the via. The electroplated material is then heated to a temperature above its flow or melting temperature in a reducing atmosphere for a time sufficient to cause the electroplated material to fill the via and any voids within the via. The step of heating the electroplated material is preferably to a temperature at least 10 degrees C. above its flow or melting temperature of the electroplated material. The reducing atmosphere is from about 5 percent to 100 percent hydrogen and the remainder preferably nitrogen. The step of electroplating can include electroplating of sufficient electroplated material in the via to provide a bump on at least one of the surfaces heating.

23 Claims, 2 Drawing Sheets

SOLID HERMETIC VIA AND BUMP FABRICATION

This application claims them benefit of provisional application No. 60/088,298, filed Jun. 5, 1988.

BACKGROUND OF THE INVENTION

1. Field of the Invention

This invention relates to a procedure for fabrication of hermetic vias which are substantially solid throughout and substantially without voids and which may include a bump or bumps on a surface or surfaces of the substrate connected by the vias.

2. Brief Description of the Prior Art

Most of the interconnect circuits built for radio frequency microwave application in 10 or 15 mils thick alumina substrates have approximately 8 mil diameter vias filled with gold. Thin film interconnect fabrication processes require solid vias (completely filled vias) to minimize multi-layer defects. During the via plating process, a gold "mushroom" grows external to the via. This gold mushroom growth external to the via can lead to a void within the via. The void within the via requires extensive cleaning after polishing. Further, the via void can hold the processing chemicals which can leak out during multi-layer processing, causing stains and potential adhesion defects. It is therefore apparent that initial avoidance of formation of the void would be highly beneficial in fabrication techniques.

In the fabrication of high frequency modules, such as, for example, receive/transmit modules, hermeticity of the module is an essential requirement. In order to obtain such hermeticity in accordance with the prior art, it has been necessary to encase the module within an hermetic metal housing. The inclusion of the metal housing materially increases the cost of fabrication of such modules.

There is currently no known method for fabrication of hermetic gold filled vias other than in accordance with the present invention.

SUMMARY OF THE INVENTION

In accordance with the present invention, the above described via related problem is minimized if not eliminated. When the vias are hermetic, the need for a separate metal housing to provide the required hermeticity is negated and there is provided a module which is hermetic and which does not require the auxiliary metal housing of the prior art.

Briefly, the problem of the prior art is overcome by providing a ceramic substrate which is a wall of the module, such as, for example, the bottom surface, with hermetic vias with the thin film interconnect functioning as the base plate of the module. Expensive hermetic feed throughs to the modules are eliminated by this invention whereby electrical connections to the module I/Os can be formed through the hermetic vias.

A package includes the bottom having one or more vias and metallization around the edges to connect a metal lid therein. A metal alloy lid is sealed to the edges of the substrate with hermetic vias bottom to form the completed package. All interconnects and circuitry are disposed on the interior surface of the bottom with all connection to the exterior made through the hermetic vias, it being understood that plural such vias can be disposed in the bottom.

Briefly, in accordance with a first embodiment of the present invention, the via is formed and plated using, generally, many of the procedures of the prior art. The steps involved are to provide the vias through a ceramic substrate, generally but not limited to alumina, preferably by laser drilling. A seed metal to which the plating material will be later used will adhere, which includes but is not limited to TiW, Ni, Cr, Ta, Ti and W, is then deposited, preferably by sputtering, over preferably one and possibly both major opposing surfaces of the substrate which will be connected together by the via and the seed metal is then covered with a dry film resist. The substrate is then properly aligned and the resist is exposed through a mask which patterns the regions of the resist to be exposed. The resist is then exposed through the mask and developed to leave seed metal and resist on one or both major surface with the via being exposed. The substrate is then placed in an electroplating, generally with gold though other platable materials can be used such as, for example, Sn/Pb, Cu and the like. The electroplating material fills the via with a central void and also can provide bumps on one or both major surfaces of the substrate, depending upon the amount of plating material used. Plating large amounts of the platable materials results in bumps on the top surface of the wafer whereas plating small amounts of the platable materials results in bumps formed on the bottom surface of the wafer following the gold melting step. The position of the large bump is controlled by the radial extent of the seed material left unetched around the vias and the mass of plating material plated. The radial extent to which the seed layer around the via is left unetched during the resist strip and seed layer etch is controlled (or defined) during the align and expose step. For example, in 10 mil thick substrates with 8 mil diameter vias and a 2 mil wide annular plating material ring around the vias, when the mass of plating material plated is 6 times the amount required to fill a via, large bumps are formed on the top side. When the mass of plating material plated is 5 times the amount required to fill a via, large bumps are formed on the bottom side. Further reduction in the amount of plating material plated makes the bump on the bottom side smaller. The "bottom" side or surface is defined herein as that surface on which the plating seed layer is sputtered. This permits the vias and the bumps, if present, to be fabricated during the same operation and thereby eliminates the sequence of operations required in the prior art for fabrication of the bumps. The resist and seed metal are then stripped and the substrate is then placed in a hydrogen-containing ambient, preferably about 10 percent hydrogen and 90 percent nitrogen though the amount of hydrogen can vary from about 5 percent to 100 percent and the other portion of the ambient can be any inert gas, at a temperature above the flow or melting temperature of the plating material and preferably at least 10 degrees C. above the flow or melting temperature of the plating material. This step causes the plating material to flow within the via and to fill the void and drive off any materials which may have been contained in the void. The major surfaces of the substrate are then polished with the plating material extending out of the via being smeared entirely or in part onto one or both major surfaces of the substrate. In this way, the bumps can be retained on one or both major surfaces and, in addition, a ground plane can be provided on a surface or surfaces of the substrate. The substrate is then cleaned to provide the final via-plated substrate.

It follows that, after sufficient plating material is plated within and around the via, the plating metal is then melted in a special ambient to form a solid plug within the via. The interaction between the substrate material and the molten plating material depends upon the plating material melting furnace ambient, the via wall plating material coverage and the mass of plating material plated. The amount of plating material used in the melted via process has been found to be less than used in prior art techniques by a factor of 5. In addition, the labor intensive void cleaning steps are eliminated.

The process modifications discussed below compared to the one discussed earlier improves the hermeticity of the vias. In accordance with a second embodiment of the present invention, the vias are provided through a ceramic substrate, generally but not limited to alumina, preferably by laser drilling. Resist is then formed on the front end of the wafer, the substrate is then properly aligned and the resist is exposed through a mask which patterns the regions of the resist to be exposed. The resist is then exposed through the mask and developed. The diameter of the resist opening around the via is approximately 4 mils larger than the via diameter. A seed metal to which the plating material will be later used will adhere, which includes but is not limited to TiW, Ni, Cr, Ta, Ti and W, is then deposited, preferably by sputtering, over both major opposing surfaces of the substrate which will be connected together by the via to leave seed metal and resist on one major surface and seed metal alone on the other major surface with the via being exposed. When the resist on the front end is removed an annular seed metal ring of width 2 mils is left around all vias. Resist is then deposited on the rear surface of the wafer, the wafer is aligned and the resist is patterned, leaving exposed seed metal around the edges of the via on the major surfaces. The diameter of the resist opening around the via is approximately 4 mils larger than the via diameter. This leaves an annular seed metal ring of width 2 mils is left around all vias. The metal rings around the vias lead to hermetic vias. The substrate is then placed in an electroplating, generally with gold though other platable materials can be used such as, for example, Sn/Pb, Cu and the like. The electroplating material partly fills the via with a pair of somewhat elliptical, preferably non-contacting gold regions which extend above and below the major wafer surfaces. The resist and seed metal are then stripped and the substrate is then placed in a hydrogen-containing ambient, preferably about 10 percent hydrogen and 90 percent nitrogen though the amount of hydrogen can vary from about 5 percent to 100 percent and the other portion of the ambient can be any inert gas, at a temperature above the flow or melting temperature of the plating material and preferably at least 10 degrees C. above the flow or melting temperature of the plating material. This step causes the plating material to flow within the via and to fill the region within the via devoid of gold and drive off any materials which may have been contained in the void. The major surfaces of the substrate are then polished with the plating material extending out of the via being smeared entirely or in part onto one or both major surfaces of the substrate. In this way, the bumps can be retained on one or both major surfaces and, in addition, a ground plane can be provided on a surface or surfaces of the substrate. The substrate is then cleaned to provide the final via-plated substrate. Simple modifications to the above process such as depositing seed layer on both sides of the substrate, coating resist on both surfaces of the substrates and patterning both surfaces of the substrate while leaving an annular seed metal ring of width 2 mils around all vias on both the surfaces also lead to hermetic vias.

It follows with both embodiments that, after sufficient plating material is plated within and around the via, the plating metal is then melted in a special ambient to form a solid plug within the via. The interaction between the substrate material and the molten plating material depends upon the plating material melting furnace ambient, the via wall plating material coverage and the mass of plating material plated. The amount of plating material used in the melted via process has been found to be less than used in prior art techniques by a factor of 5. In addition, the labor intensive void cleaning steps are eliminated.

DESCRIPTION OF THE PREFERRED EMBODIMENT

Figure 1A:
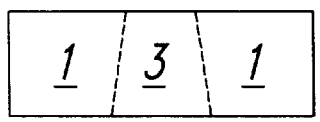
FIGS. 1a to 1h represent a process flow in accordance with a first embodiment of the present invention.
Figure 1B:
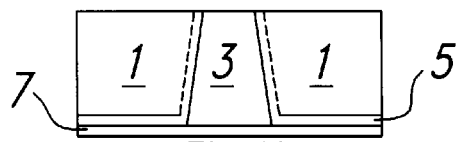
Figure 1C:
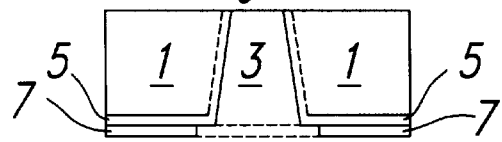
Figure 1D:
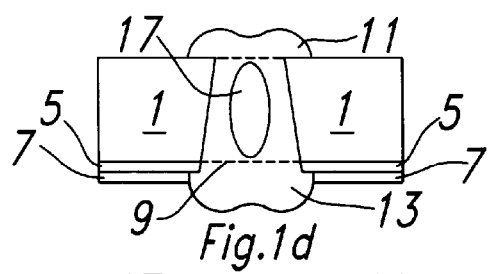
Figure 1E:
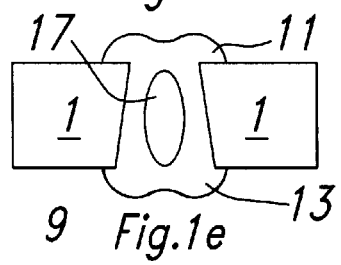
Figure 1F:
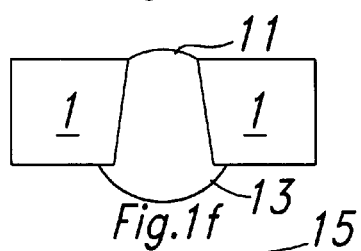
Figure 1G:
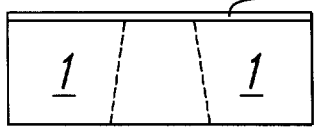
Figure 1H:
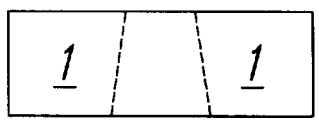

With reference to the embodiment of FIGS. 1a to 1h and referring initially to FIG. 1a, vias 3 are formed in an alumina substrate 1, preferably by laser drilling. A TiW seed metal 5 is then deposited over a major surfaces of the substrate 1 and the seed metal is then covered with a dry film resist 7 as shown in FIG. 1b. The substrate is then properly aligned and the resist 7 is exposed through a mask (not shown) which patterns the regions of the resist to be exposed. The resist is then exposed through the mask and developed to leave seed metal 5 and resist 7 on the substrate surface with the via 3 now being exposed as shown in FIG. 1c. The substrate 1 is then electroplated with gold 9 using a standard gold cyanide plating bath for a period as required to provide the required amount of gold in the via and extending therefrom, generally about 2 hours. This is shown with the gold extending out of the via 3 both above and below the major surfaces of the substrate in FIG. 1d. The electroplating fills the via with a central void 17 and also provides bumps 11 and 13 on one or both major surfaces of the substrate, depending upon the amount of plating material used. This permits the vias and the bumps to be fabricated during the same operation and thereby eliminates the sequence of operations required in the prior art for fabrication of the bumps. The resist 7 and seed metal 5 are then stripped and the substrate 1 is then placed in a hydrogen-containing ambient, preferably about 10 percent hydrogen and 90 percent nitrogen at a temperature of 1077 degrees C. and held above the gold melting temperature for 15 minutes. This step causes the plating material to displace the void 17 and drive off any materials, liquid or gaseous, which may have been contained in the void as shown in FIG. 1f. The bumps 11 and/or 13 can be retained and/or one or both of the major surfaces of the substrate 1 can be polished with the gold being smeared onto one or both major surfaces of the substrate 15 as shown in FIG. 1g. The substrate 1 is then cleaned to provide the final via-plated substrate with the void 17 being eliminated as shown in FIG. 1h as compared with the prior art.

Figure 2A:
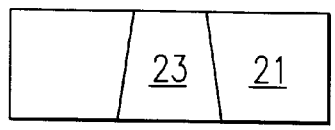
FIGS. 2a to 2h represent a process flow in accordance with a second embodiment of the present invention.
Figure 2B:
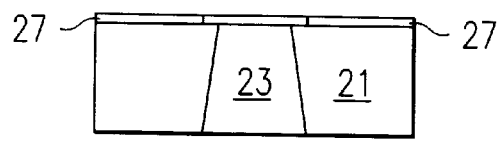
Figure 2C:
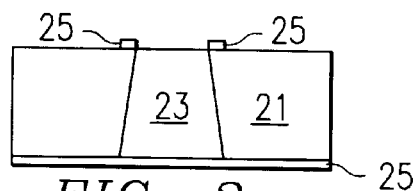
Figure 2D:
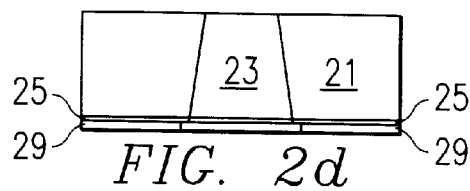
Figure 2E:
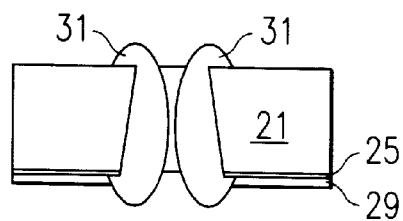
Figure 2G:
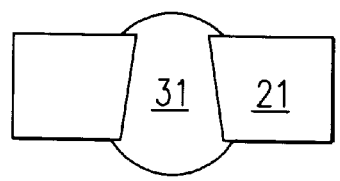
Figure 2F:
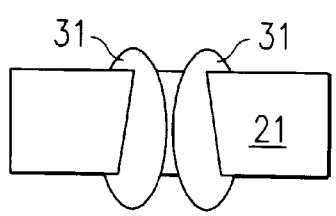
Figure 2H:
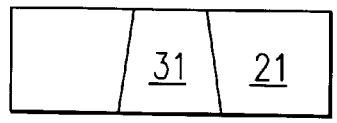

With reference to the embodiment of FIGS. 2a to 2h and referring initially to FIG. 2a, vias 23 are formed in an alumina substrate 21, preferably by laser drilling. A dry film resist 27 is then formed on the front surface of the substrate 21, the substrate then being properly aligned and the resist being exposed through a mask (not shown) which patterns the regions of the resist to be exposed. The resist is then exposed through the mask and developed as shown in FIG. 2b, a TiW seed metal 25 is then deposited over the front and rear surfaces of the substrate 21 and the resist 27 with seed metal thereover is removed as shown in FIG. 2c. A layer of resist 29 is then formed over the seed metal 25 on the rear surface of the substrate 21, the substrate is aligned and the resist is patterned as shown in FIG. 2d to leave seed metal 25 around the via 23 and resist 27 on the substrate rear surface and seed metal 25 on a portion of the front surface around the via with the via now being exposed. The substrate 21 is then electroplated with gold 29 over the seed metal 25 and within the via 23 using a standard gold cyanide plating bath for a period as required to provide the required amount of gold in the via and extending therefrom, generally about 2 hours. This is shown with essentially paraboloidally shaped gold members 29, the gold extending out of the via 23 both above and below the major surfaces of the substrate as shown in FIG. 2e. The electroplating partially fills the via 23. Bumps (not shown) can be fabricated as in the first embodiment. The resist 27 and seed metal 25 are then stripped and the substrate 21 is then placed in a hydrogen-containing ambient, preferably about 10 percent hydrogen and 90 percent nitrogen at a temperature of 1077 degrees C. and held above the gold melting temperature for 15 minutes. This step causes the plating material to fill the via 23 and drive off any materials, liquid or gaseous, which may have been contained in the via as shown in FIG. 2g. The gold 29 can then be polished with the gold being smeared onto one or both major surfaces of the substrate or removed. The substrate 21 is then cleaned to provide the final via-plated substrate.

Though the invention has been described with reference to a specific preferred embodiment thereof, many variations and modifications will immediately become apparent to those skilled in the art. It is therefore the intention that the appended claims be interpreted as broadly as possible in view of the prior art to include all such variations and modification.

What is claimed is:

1. A method of forming an electrically conductive via in a substrate which comprises the steps of:
   (a) providing a ceramic substrate having a pair of opposing surfaces and a via extending between said opposing surfaces;
   (b) providing on one/or both of said surfaces a layer of a material capable of forming a seed for receiving thereon a plating material extending to said via;
   (c) placing the structure of step (b) into an electroplating bath to electroplate the walls of said via; and
   (d) heating the electroplated material to a temperature above its flow point in a reducing atmosphere for a time sufficient to cause said electroplated material to fill said via.

2. The method of claim 1 wherein said step of heating includes the step of heating said electroplated material to a temperature from about 10 to about 25 degrees C. above its flow temperature.

3. The method of claim 1 wherein said reducing atmosphere includes from about 5 percent to 100 percent hydrogen.

4. The method of claim 2 wherein said reducing atmosphere includes from about 5 percent to 100 percent hydrogen.

5. The method of claim 1 wherein said electroplated material is gold.

6. The method of claim 2 wherein said electroplated material is gold.

7. The method of claim 3 wherein said electroplated material is gold.

8. The method of claim 4 wherein said electroplated material is gold.

9. The method of claim 3 wherein the remainder of said reducing atmosphere is substantially nitrogen.

10. The method of claim 4 wherein the remainder of said reducing atmosphere is substantially nitrogen.

11. The method of claim 7 wherein the remainder of said reducing atmosphere is substantially nitrogen.

12. The method of claim 8 wherein the remainder of said reducing atmosphere is substantially nitrogen.

13. The method of claim 2 wherein step (c) includes the step of electroplating sufficient electroplated material in said via to provide a bump on at least one of said surfaces after step (d).

14. The method of claim 3 wherein step (c) includes the step of electroplating sufficient electroplated material in said via to provide a bump on at least one of said surfaces after step (d).

15. The method of claim 4 wherein step (c) includes the step of electroplating sufficient electroplated material in said via to provide a bump on at least one of said surfaces after step (d).

16. The method of claim 6 wherein step (c) includes the step of electroplating sufficient electroplated material in said via to provide a bump on at least one of said surfaces after step (d).

17. The method of claim 8 wherein step (c) includes the step of electroplating sufficient electroplated material in said via to provide a bump on at least one of said surfaces after step (d).

18. The method of claim 10 wherein step (c) includes the step of electroplating sufficient electroplated material in said via to provide a bump on at least one of said surfaces after step (d).

19. The method of claim 12 wherein step (c) includes the step of electroplating sufficient electroplated material in said via to provide a bump on at least one of said surfaces after step (d).

20. The method of claim 1 wherein sa id electroplated material forms voids within said via, said step of heating the electroplated material to a temperature above its flow point in a reducing atmosphere being for a time sufficient to cause said electroplated material to fill said voids within said via.

21. The method of claim 20 wherein said reducing atmosphere includes from about 5 percent to 100 percent hydrogen.

22. The method of claim 20 wherein said electroplated material is gold.

23. The method of claim 21 wherein said electroplated material is gold.

* * * * *